United States Patent
Kao et al.

(10) Patent No.: US 9,558,974 B2
(45) Date of Patent: Jan. 31, 2017

(54) SEMICONDUCTOR PROCESSING STATION AND METHOD FOR PROCESSING SEMICONDUCTOR WAFER

(71) Applicants: Mao-Lin Kao, Miaoli County (TW); Hsu-Shui Liu, Taoyuan County (TW); Tien-Chen Hu, New Taipei (TW); Li-Jen Ko, Hsinchu County (TW); Hsiang-Yin Shen, Hsinchu (TW); Jiun-Rong Pai, Hsinchu County (TW)

(72) Inventors: Mao-Lin Kao, Miaoli County (TW); Hsu-Shui Liu, Taoyuan County (TW); Tien-Chen Hu, New Taipei (TW); Li-Jen Ko, Hsinchu County (TW); Hsiang-Yin Shen, Hsinchu (TW); Jiun-Rong Pai, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 211 days.

(21) Appl. No.: 13/629,498

(22) Filed: Sep. 27, 2012

(65) Prior Publication Data
US 2014/0086720 A1    Mar. 27, 2014

(51) Int. Cl.
*H01L 21/677* (2006.01)
*H01L 21/67* (2006.01)

(52) U.S. Cl.
CPC ... *H01L 21/67161* (2013.01); *H01L 21/67184* (2013.01)

(58) Field of Classification Search
CPC .. H01L 21/67; H01L 21/677; H01L 21/67161; H01L 21/67184
USPC ................... 414/217, 222.01, 939
See application file for complete search history.

(56) References Cited

U.S. PATENT DOCUMENTS

| | | | |
|---|---|---|---|
| 8,192,131 B1 * | 6/2012 | Stevens et al. | 414/217 |
| 9,245,780 B2 * | 1/2016 | Shimomura | H01L 21/67161 |
| 2004/0238122 A1 * | 12/2004 | Ishizawa | H01L 21/67109 156/345.31 |
| 2007/0107845 A1 * | 5/2007 | Ishizawa | H01L 21/67109 156/345.32 |
| 2008/0101893 A1 * | 5/2008 | Tanzawa | H01L 21/67126 414/217.1 |
| 2008/0138178 A1 * | 6/2008 | Ferrara | H01L 21/67201 414/217.1 |
| 2008/0232948 A1 * | 9/2008 | van der Meulen et al. | 414/805 |
| 2010/0178135 A1 * | 7/2010 | Laceky | B25J 19/0029 414/217 |

(Continued)

FOREIGN PATENT DOCUMENTS

| | | | |
|---|---|---|---|
| CN | 101091241 A | 12/2007 | |
| JP | 2011-263193 | * 12/2011 | H01L 21/67161 |

(Continued)

*Primary Examiner* — Michael McCullough
*Assistant Examiner* — Ashley Romano
(74) *Attorney, Agent, or Firm* — McDermott Will & Emery LLP

(57) ABSTRACT

A semiconductor processing station is provided. The semiconductor processing station includes a first platform, a second platform and a vacuum tunnel, wherein the first platform has a first load lock and a first plurality of chambers, and the second platform has a second load lock and a second plurality of chambers, and the vacuum tunnel connects the first and the second load locks.

23 Claims, 5 Drawing Sheets

(56) References Cited

U.S. PATENT DOCUMENTS

2011/0033636 A1* 2/2011 Nishimura ........ H01J 37/32192
                                                427/557
2014/0003891 A1* 1/2014 Kobayashi .................... 414/217
2014/0140792 A1* 5/2014 Kao .................. H01L 21/67161
                                                414/217

FOREIGN PATENT DOCUMENTS

TW        200410305 A    6/2004
TW        I272665 B      2/2007

* cited by examiner

SEMICONDUCTOR PROCESSING STATION AND METHOD FOR PROCESSING SEMICONDUCTOR WAFER

TECHNICAL FIELD

The present disclosure relates to a semiconductor fabrication, and more particularly to a semiconductor processing station and a method for processing semiconductor wafer.

BACKGROUND

As the semiconductor manufacturing processes grow in complexity, it becomes increasingly necessary to transfer wafers among a number of different process modules or tools, and those tools are usually separated by significant distances, which may result in increased risk of particle contamination of wafers, when wafers are transferred between separate vacuum tools. Therefore, it usually depends on the vendors to develop or integrate in-situ tool to fulfill the semiconductor manufacturing process requirement, but in this way, it induces the IP leakage and poor flexibility on vendor selection. On the other hand, because the wafer per hour (WPH) of the processing chambers of the platform is unbalanced, the productivity of the platform is very low. Some processing chambers with high WPH need to wait for those with low WPH, which lowers the utilization of the processing chambers. For solving this problem, some traditional methods, such as the linear platform connects extra processing chambers to the platform to increase the chamber quantity of the platform. However, the business model of the chambers' procurement and operations is complicated, and the integration and software development for multi-chamber combination is complicated, either.

Hence, because of the defects in the prior arts, there is a need to solve the above problems.

SUMMARY

In accordance with one aspect of the present disclosure, a semiconductor processing station is provided. The semiconductor processing station includes a first platform, a second platform and a vacuum tunnel, wherein the first platform has a first load lock and a first plurality of chambers, and the second platform has a second load lock and a second plurality of chambers, and the vacuum tunnel connects the first and the second load locks.

In accordance with another aspect of the present disclosure, a method for processing a semiconductor wafer in a semiconductor processing station including a first and a second cluster platforms, each of which includes a plurality of chambers is provided. The method includes steps of providing the semiconductor wafer in the first cluster platform, and transferring the semiconductor wafer between the first and the second cluster platforms in a vacuum.

In accordance with one more aspect of the present disclosure, a semiconductor processing station is provided. The system includes a first platform, a second platform and a vacuum tunnel, wherein the first platform includes a first plurality of chambers, and the second platform includes a second plurality of chambers, and the vacuum tunnel communicates with the first and the second platforms.

BRIEF DESCRIPTION OF THE DRAWINGS

The present disclosure is best understood from the following detailed description when read with the accompanying figures. It is emphasized that, in accordance with the standard practice in the industry, various features are not shown to scale and are used for illustration purposes only. In fact, the dimensions of the various features may be arbitrarily increased or reduced for clarity of discussion.

DETAILED DESCRIPTION

Figure 1:
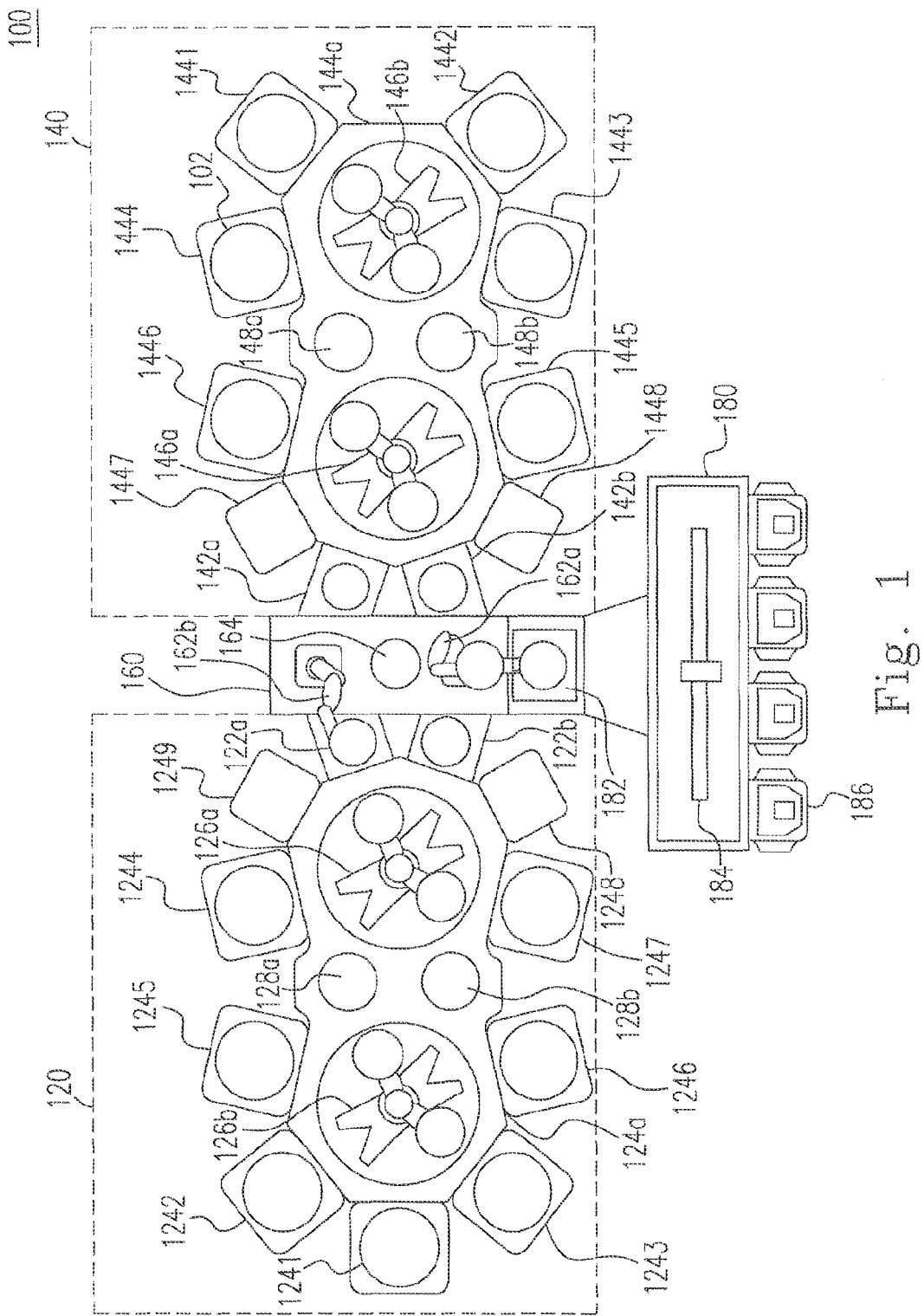
FIG. 1 shows a semiconductor processing station in accordance with an embodiment of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The present disclosure will now be described by a detailed description of several embodiments. It is clear that other embodiments can be configured according to the knowledge of persons skilled in the art without departing from the true technical teaching of the present disclosure, the claimed invention being limited only by the terms of the appended claims.

Hereafter, embodiments of the present invention will be explained in detail with reference to the accompanying drawings.

Figure 2:
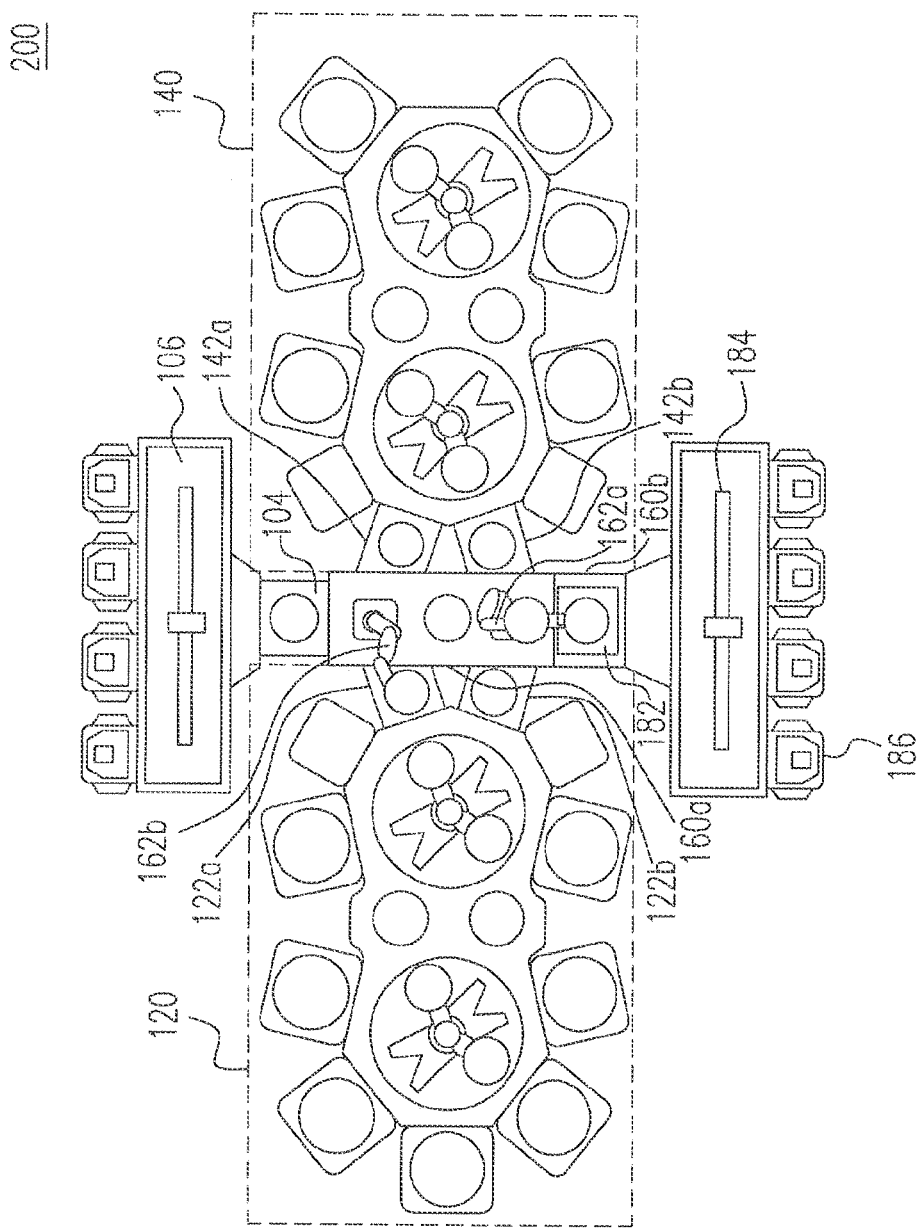
FIG. 2, which shows a semiconductor processing station in accordance with another embodiment of the present disclosure FIG. 3, which shows a semiconductor processing station in accordance with another embodiment of the present disclosure.

FIG. 1 shows a semiconductor processing station 100 in accordance with an embodiment of the present disclosure. The semiconductor processing station 100 includes a first platform 120, a second platform 140 and a vacuum tunnel 160, wherein the first platform 120 has the first load lock 122a and a first plurality of chambers 1241, 1242, 1243, 1244, 1245, 1246, 1247, 1248, 1249, and the second platform 140 has a second load lock 142a and a second plurality of chambers 1441. 1442. 1443. 1444, 1445, 1446, 1447, 1448, and the vacuum tunnel 160 connects the first load lock 122a and the second load lock 142a. In some embodiments, the vacuum tunnel 160 further includes a vacuum robot 162a. During the manufacturing processes of a wafer 102, the vacuum robot 162a transfers the wafer 102 between the first load lock 122a and the second load lock 142a. In another embodiment, the vacuum tunnel 160 has a first side 160a coupled to the first load lock 122a, and has a second side 160b opposite to the first side 160a and coupled to the second load lock 142, which may lead the first platform 120 connected face to face with the second platform 140 (as shown in FIG. 2). In still another embodiment, each of the first and the second platforms 120 and 140 includes one selected from a group consisting of a cluster platform, a linear platform and a lean platform, and the present disclosure takes the cluster platform as the implementation of the first platform 120 and the second platform 140, as shown in FIG. 1.

Referring to FIG. 1, the semiconductor processing station 100 further includes a first equipment front end module (EFEM) 180 and a third load lock 182, wherein the first EFEM 180 is coupled to the third load lock 182, and the third load lock 182 is coupled to the vacuum tunnel 160. The third load lock 182 is used to facilitate transfer of the wafer 102 between the vacuum environment of the vacuum tunnel 160 and the atmosphere environment of the first EFEM 180. The first EFEM 180 includes an interface robot 184 and a load port 186, wherein the interface robot 184 is responsible for transferring the wafer 102 between the third load lock 182 and the load port 186. In a condition, the interface robot 184 transfers the wafer 102 from the load port 186 to the third load lock 182, and the vacuum robot 162a transfers the wafer 102 from the third load lock 182 to the first load lock 122a to start multiple processes in the first platform 120. After finishing the processes in first platform 120, the processed wafer 102 is put into the first load lock 122a, and the vacuum robot 162a transfers the processed wafer 102 from the first load lock 122a to the second load lock 142a to do multiple processes in the second platform 140. After finishing the processes in the second platform 140, the processed wafer 102 is put into the second load lock 142a, and the vacuum robot 162 transfers the processed wafer 102 from the second load lock 142a to the third load lock 182. The interface robot 184 transfers the processed wafer 102 from the third load lock 182 to the load port 186, thus finishing the manufacturing processes. In some embodiments, the load port 186 includes an FOUP (Front Opening Unified Pod) for storing many wafers.

Referring to FIG. 1, the first platform 120 includes the first plurality of chambers 1241, 1242, 1243, 1244, 1245, 1246, 1247, 1248, 1249, and the first load lock 122a and 122b disposed adjacent to the first plurality of chambers 1248 and 1249, respectively. The second platform 140 includes the second plurality of chambers 1441. 1442. 1443. 1444, 1445, 1446, 1447, 1448, and the second load locks 142a and 142b are disposed adjacent to the second plurality of chambers 1467 and 1468, respectively. In some embodiments, the first plurality of chambers 1241, 1242, 1243, 1244, 1245, 1246, 1247, 1248, 1249 are typically coupled to a first central transfer chamber 124a that houses at least one transfer robot 126a (such as two transfer robots 126a and 126b) to facilitate transfer of the wafer between the surrounding first plurality of chambers 1241, 1242, 1243, 1244, 1245, 1246, 1247, 1447, 1448, and the second plurality of chambers 1241, 1242, 1243, 1244, 1245, 1246, 1247, 1447, 1448 are typically coupled to a second central transfer chamber 144a that houses at least one transfer robot 146a (such as two transfer robots 146a and 146b) to facilitate transfer of the wafer between the surrounding second plurality of chambers 1441. 1442. 1443. 1444, 1445, 1446, 1447, 1448. The transfer robots 126a, 126b, 146a and 146b have a range of motion that is used to transfer the wafer among the surrounding first plurality of chambers 1241, 1242, 1243, 1244, 1245, 1246, 1247, 1447, 1448 and the second plurality of chambers 1441. 1442. 1443. 1444, 1445, 1446, 1447, 1448.

In another embodiment, the first plurality of chambers 1241, 1242, 1243 are the first processing chambers, and the first plurality of chambers 1245, 1246 are the second processing chambers, and the first plurality of chambers 1244, 1247 are the third processing chambers, and the first plurality of chambers 1248, 1249 are the fourth processing chambers. On the other hand, the second plurality of chambers 1441. 1442. 1443. 1444 are the fifth processing chambers, and the second plurality of chambers 1445, 1446 are the sixth processing chambers, and the second plurality of chambers 1447, 1448 are the seventh processing chambers. The WPH (wafer per hour) of the first, second, third, fourth, fifth, sixth and seventh processing chambers may be different. For example, the WPH of the first processing chambers are lower than that of the second and third processing chambers, and the WPH of the fifth processing chambers are lower than that of the sixth processing chambers. Besides, it can be appreciate that each of the first, second, third, fourth, fifth, sixth and seventh processing chambers may be utilized as etching chambers, physical vapor deposition chambers, chemical vapor deposition chambers, ion implantation chambers, lithography chambers and the like. In still another embodiment, the first platform 120 is responsible for a first manufacturing process, and the second platform is responsible for a second manufacturing process.

Referring to FIG. 1, the first transfer chamber 124a includes at least one first vacancy 128a (such as 128a and 128b) and the second transfer chamber 144a includes at least one second vacancy 148a (such as 148a and 148b). In some embodiments, the first vacancies 128a, 128b and the second vacancies 148a, 148b are used for positioning the processed wafers and letting the processed wafer wait for the next process (as explained infra). In another embodiment, the first vacancies 128a, 128b and the second vacancies 148a, 148b are places used for cooling the processed wafer 102.

Referring to FIG. 1, the interface robot 184 transfers the wafer 102 from the load port 186 to the third load lock 182, and the vacuum robot 162a transfers the wafer 102 from the third load lock 182 to the first load lock 122b. Then, the transfer robot 126a transfers the wafer 102 from the first load lock 122b to one of the first plurality of chambers 1241, 1242, 1243, 1244, 1245, 1246, 1247, 1248, 1249 to start processes in the first platform 120, and after finishing the processes in the first platform 120, the transfer robot 126a transfers the processed wafer 102 from the first plurality of chambers 1241, 1242, 1243, 1244, 1245, 1246, 1247, 1248, 1249 to the first load lock 122a. Next, the vacuum robot 162a transfers the processed wafer 102 from the first load lock 122a to the second load lock 142a, and the transfer robot 146a transfers the processed wafer 102 from the second load lock 142a to one of the second plurality of chambers 1441. 1442. 1443. 1444, 1445, 1446, 1447, 1448 to start processes in the second platform 140, and after finishing the processes in the second platform 140, the transfer robot 146a transfers the processed wafer 102 from the second plurality of chambers 1441. 1442. 1443. 1444, 1445, 1446, 1447, 1448 to the second load lock 142b. The vacuum robot 162a transfers the processed wafer 102 from the second load lock 142b to the third load lock 182, and the interface robot 184 transfers the processed wafer 102 from the third load lock 182 back to the load port 186, thus finishing the manufacturing process.

In some embodiments, due to the limitation of the moving distance of the transfer robot 126a, the semiconductor processing 100 uses the transfer robot 126a and the transfer robot 126b. When the transfer distance is beyond the moving distance of the transfer robot 126a, the transfer robot 126a transfers the wafer 102 from the first load lock 122b to the first vacancy 128a, and the transfer robot 126b transfers the wafer 102 from the first vacancy 128a to the target chamber in the first platform 120, and after the processes in the first platform 120 are finished, the transfer robot 126b transfers the processed wafer 102 from the target chamber to the second vacancy 128b. The transfer robot 126a transfers the processed wafer 102 from the second vacancy 128b to the first load lock 122a. Then, the vacuum robot 162a transfers the processed wafer 102 from the first load lock 122a to the second load lock 142a. The operations of the transfer robots 146a and 146b in the second platform 140 are like those of the transfer robots 126a and 126b in the first platform 120.

In another embodiment, the vacuum tunnel 160 includes two vacuum robots 162a, 162b and a wafer stage 164, as shown in FIG. 1. The interface robot 184 transfers the wafer 102 from the load port 186 to the third load lock 182, and the vacuum robot 162a transfers the wafer 102 from the third load lock 182 to the first load lock 122b, and after the wafer 102 finishes the processes in the first platform 120, the transfer robot 126a transfers the wafer 102 from the first plurality of chambers 1241, 1242, 1243, 1244, 1245, 1246, 1247, 1248, 1249 to the first load lock 122a. Next, the vacuum robot 162b transfers the processed wafer 102 from the first load lock 122a to the wafer stage 164, and when the second load lock 142 is available, the vacuum robot 162b transfers the processed wafer 102 from the wafer stage 164 to the second load lock 142a. After the processed wafer 102 finishes the processes in the second platform 140, the transfer robot 146a transfers the processed wafer 102 from the second plurality of chambers 1441. 1442. 1443. 1444, 1445, 1446, 1447, 1448 to the second load lock 142b, and the vacuum robot 162b transfers the processed wafer 102 from the second load lock 142b to the wafer stage 164. Then, the vacuum robot 162a transfers the processed wafer 102 from the wafer stage 164 back to the first EFEM 180.

Refer to FIG. 2, which shows a semiconductor processing station 200 in accordance with another embodiment of the present disclosure. The semiconductor processing station 200 further includes a fourth load lock 104 and a second EFEM 106. The interface robot 184 transfers the wafer 102 from the load port 186 to the third load lock 182, and the vacuum robot 162a transfers the wafer 102 from the third load lock 182 to the first platform 120. After the wafer 102 finishes the processes in the first platform 120, the vacuum robot 162b transfers the processed wafer from the first platform 120 to the second platform 140. After the processed wafer 102 finishes the processes in the second platform 140, the vacuum robot 162b transfers the processed wafer 102 from the second platform 140 to the fourth load lock 104, and the processed wafer 102 is sent back to the EFEM 106. Comparing the operation of the semiconductor processing station 100 mentioned above with that of the semiconductor processing station 200, the difference between them is merely that: when the processes in the second platform 140 are finished, the processed wafer 102 is put into the second load lock 142a, and the vacuum robot 162b transfers the processed wafer 102 to the second EFEM 106 through the fourth load lock 104.

Figure 3:
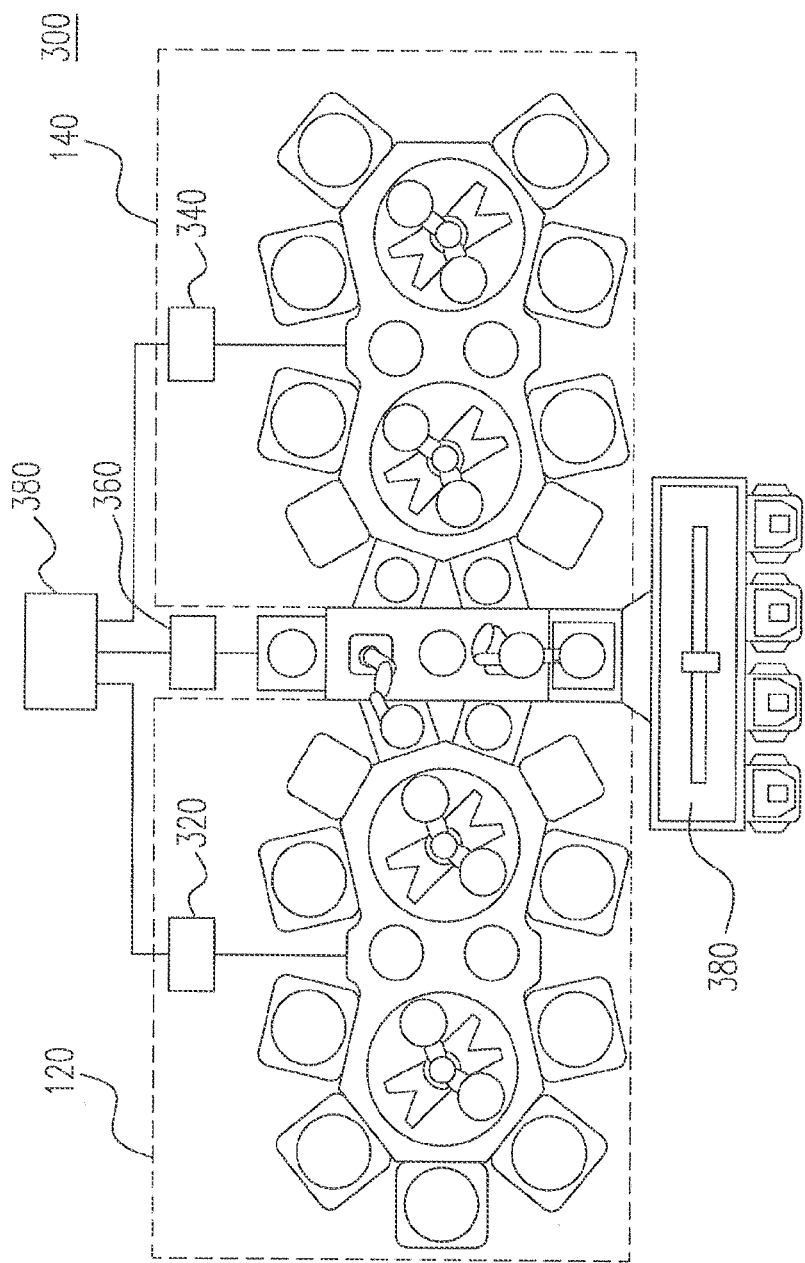

Refer to FIG. 3, which shows a semiconductor processing station 300 in accordance with another embodiment of the present disclosure. The first platform 120 includes a first control system 320 controlling the operation of the first platform 120, and the second platform 140 includes a second control system 340 controlling an operation of the second platform 140. The semiconductor processing station 300 further includes a third control system 360 and a host control system 380, wherein the third control system 360 controls operations of the first EFEM 180, the third load lock 182 and the vacuum tunnel 160, and the host control system 380 controls an operation of the semiconductor processing station 300. That is to say, the host control system 380 controls the interactions of the first, the second, and the third control systems, and designates the working flow of the three systems mentioned above to manipulate the operation of the semiconductor processing station 300, although the operations of the first, the second platforms 120, 140 are independent, respectively. In some embodiments, the first platform 120 and the second platform 140 may operate at the same time.

Figure 4:
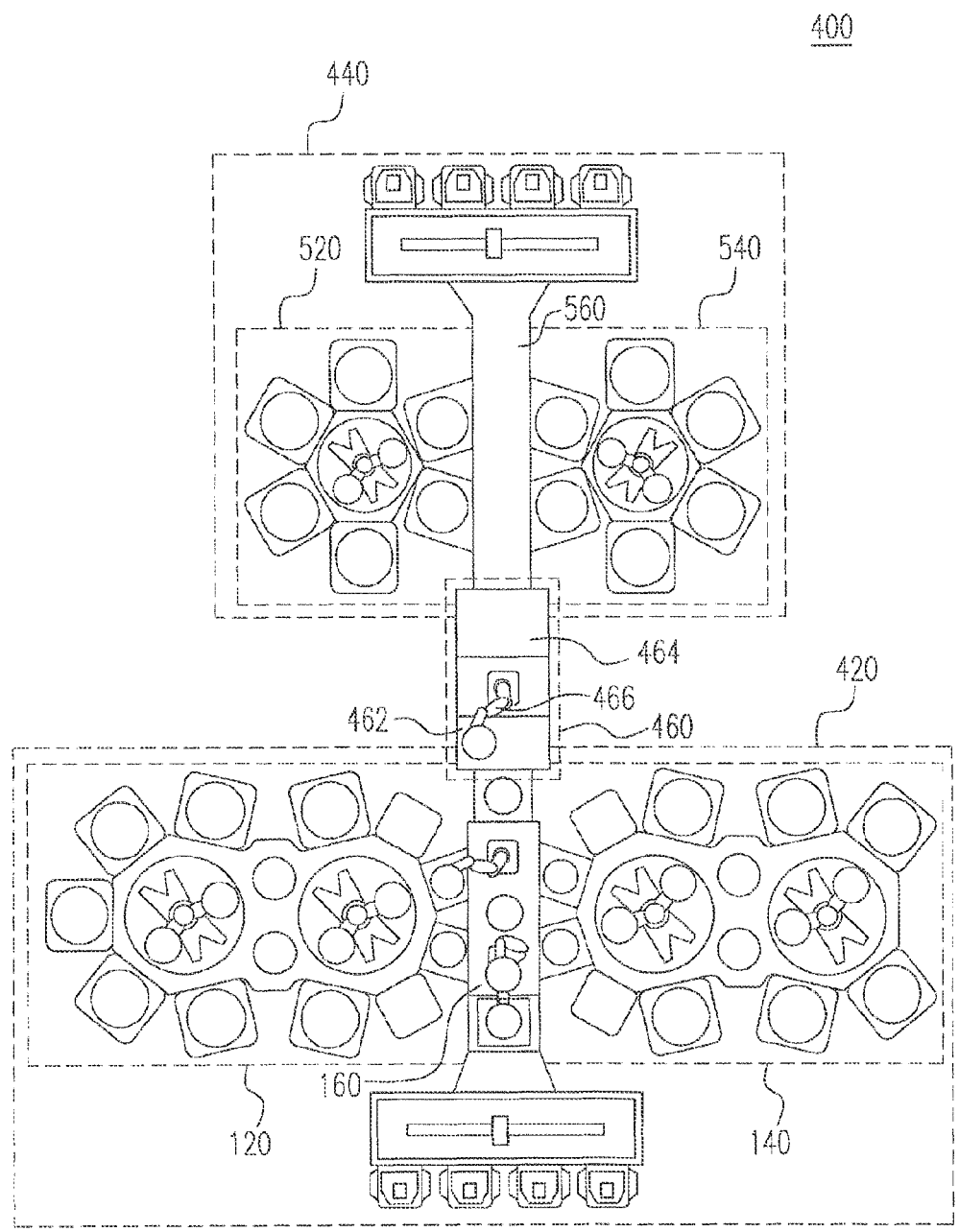
FIG. 4 shows a semiconductor processing station in accordance with another embodiment of the present disclosure.

FIG. 4 shows a semiconductor processing station 400 in accordance with another embodiment of the present disclosure. The semiconductor processing station 400 includes a first sub-processing station 420 and a second sub-processing station 440, and a buffer stage 460 coupled between the first and the second sub-processing stations 420 and 440. The first and the second sub-processing stations 420 and 440 are implementations of the semiconductor processing station 100 mentioned above, respectively. The buffer stage 460 includes a first sub-buffer stage 462, a second sub-buffer stage 464 and a buffer robot 466, wherein the first sub-buffer stage 462 coupled to the first sub-processing station 420 and the second sub-buffer stage 464 coupled to the second sub-processing station 440. The buffer robot 466 is disposed between the first sub-buffer stage 462 and the second sub-buffer stage 464.

Refer to FIG. 4, the first sub-processing station 420 includes the first platform 120, the second platform 140 and the vacuum tunnel 160, and the second sub-processing station 440 includes a third platform 520, a fourth platform 540 and a vacuum tunnel 560. The configurations of the third platform 520 and the fourth platform 540 are like those of the first and the second platforms 120 and 140, and the configuration of the vacuum tunnel 560 is like that of the vacuum tunnel 160. In some embodiments, the first, second, third and fourth platforms are responsible for a first, second, third and fourth manufacturing processes, respectively. The wafer is transferred into the first platform 120 for doing the first manufacturing process, and then the vacuum robot transfers the processed wafer from the first platform 120 to the second platform 140 through the vacuum tunnel 160. After finishing the process in the second platform 140, the processed wafer is transferred from the second platform 140 to the first sub-buffer stage 462. When the second sub-processing station 440 is available, the buffer robot 466 transfers the processed wafer from the first sub-buffer stage 462 to the second sub-buffer stage 464, and the processed wafer is transferred to the third platform 520 to do the third manufacturing process. After finishing the third manufacturing process, the processed wafer is transferred to the fourth platform 540 to do the fourth manufacturing process through the vacuum tunnel 560. It should be appreciate that the processing sequence of the first, second, third and fourth platforms mentioned above (the wafer transferred from the first sub-processing system 420 to the second sub-processing system 440) is merely used for exemplifying the operation of the semiconductor processing station 400, and the processing sequence may be different. For example, the wafer may be transferred from the second sub-processing system 440 to the first sub-processing system 420. In some embodiments, the buffer stage 460 has operating pressure in a range of $10^{-4}$ to $10^{-6}$ atmosphere. In another embodiment, the vacuum tunnels 160, 560 have operating pressure in a range of $10^{-4}$ to $10^{-6}$ atmosphere. Therefore, the wafer is transferred in vacuum between the first sub-processing station 420 and the second sub-processing station 440 through the buffer stage 460, by reducing the risk of particle contamination of wafers.

Based on the above mentioned, the present disclosure has many advantages over the conventional tools. On one hand, the semiconductor processing station disclosed in the present disclosure may link multi-platforms together through a vacuum tunnel to accomplish a manufacturing process without concerning about the particle contamination of the wafer. On the other hand, the semiconductor processing station is not limited by the numbers of the chambers, much more processing chambers with much lower WPH than that with much higher WPH in the first and the second platforms can be disposed to increase the productivity of the semiconductor processing station and lower the individual chamber down time impact as as previously described.

Figure 5:
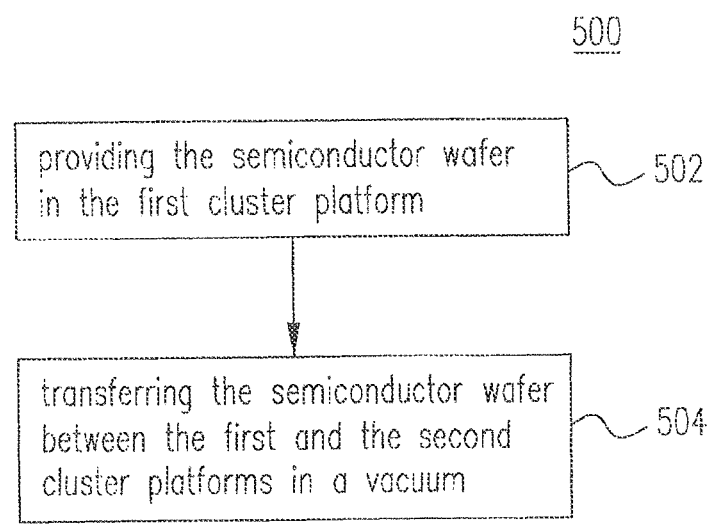
FIG. 5 shows a flow chart of a method for processing a semiconductor wafer in a semiconductor processing station in accordance with an embodiment of the present disclosure.

FIG. 5 shows a flow chart of a method 500 for processing a semiconductor wafer 102 in a semiconductor processing station 100 in accordance with an embodiment of the present disclosure. The semiconductor processing station 100 includes a first and a second cluster platforms (such as the first and the second platforms 120 and 140), the first cluster platform includes a first plurality of chambers (such as the first plurality of chambers 1241, 1242, 1243, 1244, 1245, 1246, 1247, 1248, 1249) and the second cluster platform includes a second plurality of chambers (such as the second plurality of chambers 1441. 1442. 1443. 1444, 1445, 1446, 1447, 1448). In step 502, the semiconductor wafer 102 is provided in the first cluster platform, such as the first platform 120. In step 504, the semiconductor wafer 102 is transferred between the first and the second cluster platforms in vacuum. In some embodiments, the first cluster platform includes a first load lock (such as the first load lock 122a), and the second cluster platform includes a second load lock (such as the second load lock 142a). In another embodiment, the semiconductor wafer is transferred between the first and the second cluster platforms through the first and the second load locks. In still another embodiment, the transferring step includes a sub-step of transferring the semiconductor wafer 102 between the first and the second cluster platforms through a vacuum tunnel 160.

In accordance with embodiments of the present disclosure, a semiconductor processing station includes a first platform, a second platform and a vacuum tunnel, wherein the first platform has a first load lock and a first plurality of chambers, the second platform has a second load lock and a second plurality of chambers, and the vacuum tunnel connects the first and the second load locks.

In various implementations, the vacuum tunnel has a first side coupled to the first load lock, and has a second side coupled to the second load lock, wherein the second side is opposite to the first side. The semiconductor processing station further includes an equipment front end module (EFEM) and a third load lock, wherein the EFEM is coupled to the third load lock, and the third load lock is coupled to the vacuum tunnel. The EFEM further includes an interface robot and a load port, wherein the EFEM is at atmosphere pressure. The semiconductor processing station further includes a third control system controlling an operation of the EFEM, the third load lock and the vacuum tunnel, and the first platform includes a first control system controlling an operation of the first platform, and the second platform includes a second control system controlling an operation of the second platform. Each of the first and the second platforms includes one selected from a group consisting of a cluster platform, a linear platform and a lean platform. The vacuum tunnel further includes at least one vacuum robot and one wafer stage disposed beside the vacuum robot, wherein the vacuum tunnel has operating pressure in a range of $10^{-4}$ to $10^{-6}$ atmosphere. The semiconductor processing station further includes a buffer stage coupled to the vacuum tunnel, wherein the buffer stage has operating pressure in a range of $10^{-6}$ atmosphere.

In accordance with embodiments of the present disclosure, a method for processing a semiconductor wafer in a semiconductor processing station is provided. The semiconductor processing station includes a first and a second cluster platforms, each of which includes a plurality of chambers. The method includes the following steps: providing the semiconductor wafer in the first cluster platform; and transferring the semiconductor wafer between the first and the second cluster platforms in vacuum. In one aspect, the first cluster platform includes a first load lock, and the second cluster platform includes a second load lock. In another aspect, the semiconductor wafer is transferred between the first and the second cluster platforms through the first and the second load lock. In still another aspect, the transferring step includes a sub-step of transferring the semiconductor wafer between the first and the second cluster platforms through a vacuum tunnel.

In accordance with some embodiments of the present disclosure, a semiconductor processing station includes a first platform, a second platform and a vacuum tunnel, wherein the first platform includes a first plurality of chambers, the second platform includes a second plurality of chambers, and the vacuum tunnel communicates with the first and the second platforms. In one aspect, the vacuum tunnel includes a first side, a second side, a first end and a second end, wherein the second end is opposite to the first side, and the second end is opposite to the first end. The first platform is connected to the first side, and the second platform is connected to the second side. In another aspect, the semiconductor processing station further includes an EFEM and a buffer stage, wherein the EFEM is connected to the first end, the buffer stage is connected to the second end, and each of the first and the second platforms includes one selected from a group consisting of a cluster platform, a linear platform and a lean platform.

While the invention has been described in terms of what is presently considered to be the most practical and preferred embodiments, it is to be understood that the invention needs not be limited to the disclose embodiments. Therefore, it is intended to cover various modifications and similar arrangements included within the spirit and scope of the appended claims, which are to be accorded with the broadest interpretation so as to encompass all such modifications and similar structures.

What is claimed is:

1. A semiconductor processing station, comprising:
   a first platform having a first load lock, a first plurality of processing chambers, and at least one first platform robot within the first platform arranged to transfer a wafer between the first plurality of processing chambers for processing the wafer;
   a second platform having a second load lock, a second plurality of processing chambers, and at least one second platform robot within the second platform arranged to transfer the processed wafer between the second plurality of processing chambers for additional processing; and
   a vacuum tunnel connecting the first and the second load locks, wherein the vacuum tunnel has a first side adjacent to the first platform and a second side opposite to the first side and adjacent to the second platform,
   wherein one of the at least one first platform robot is arranged to directly transfer, via a first single robot arm, the wafer between two of the first plurality of processing chambers and directly transfer, via said first single robot arm, the wafer between the first load lock and the first plurality of processing chambers, and
   wherein one of the at least one second platform robot is arranged to directly transfer, via a second single robot arm, the wafer between two of the second plurality of processing chambers and directly transfer, via said second single robot arm, the wafer between the second load lock and the second plurality of processing chambers.

2. The semiconductor processing station as claimed in claim 1, further comprising:
   an equipment front end module (EFEM); and
   a third load lock coupled between the EFEM and an end of the vacuum tunnel that extends between the first side and the second side.

3. The semiconductor processing station as claimed in claim 1,
   wherein the vacuum tunnel comprises a first stationary vacuum robot, a second stationary vacuum robot, and a stationary wafer stage disposed between the first stationary vacuum robot and the second stationary vacuum robot,
   wherein the first stationary vacuum robot is arranged to transfer the processed wafer from the first load lock to the stationary wafer stage, to transfer the processed wafer from the stationary wafer stage to the second load lock, and to transfer the processed wafer from the second load lock to the stationary wafer stage following the additional processing in the second platform, and
   wherein the second stationary vacuum robot is arranged to transfer the wafer from a third load lock to the first platform and to transfer the processed wafer from the stationary wafer stage back to the third load lock.

4. The semiconductor processing station as claimed in claim 3, wherein the first stationary vacuum robot is arranged to transfer the processed wafer from the stationary wafer stage to the second load lock when the second load lock is available.

5. The semiconductor processing station as claimed in claim 3, further comprising an additional load lock in the first platform, wherein the second stationary vacuum robot is configured to transfer the wafer from the third load lock to the additional load lock in the first platform, and wherein the first platform robot is configured to transfer the wafer between the additional load lock, the first plurality of processing chambers, and the first load lock.

6. The semiconductor processing station as claimed in claim 2, wherein the EFEM further comprises an interface robot and a load port, and wherein the EFEM is at atmospheric pressure.

7. The semiconductor processing station as claimed in claim 2, further comprising a control system controlling an operation of the EFEM, the third load lock and the vacuum tunnel.

8. The semiconductor processing station as claimed in claim 1, wherein each of the first and the second platforms includes one selected from a group consisting of a cluster platform, a linear platform and a lean platform.

9. The semiconductor processing station as claimed in claim 1, further comprising a host control system controlling an operation of the semiconductor processing station.

10. The semiconductor processing station as claimed in claim 1, wherein the first platform includes a first control system controlling an operation of the first platform and the second platform includes a second control system controlling an operation of the second platform.

11. The semiconductor processing station as claimed in claim 1, further comprising a buffer stage coupled to the vacuum tunnel, wherein the buffer stage has an operating pressure in a range of $10^{-4}$ to $10^{-6}$ atmosphere, and wherein the vacuum tunnel has an operating pressure in a range of $10^{-4}$ to $10^{-6}$ atmosphere.

12. A semiconductor processing station, comprising:
   a first platform including a first load lock and a first plurality of processing chambers and at least one first platform robot within the first platform arranged to transfer a wafer between the first plurality of processing chambers for processing the wafer;

a second platform including a second load lock and a second plurality of processing chambers and at least one second platform robot within the second platform arranged to transfer the processed wafer between the second plurality of processing chambers for additional processing;

a vacuum tunnel communicating with the first and the second platforms, wherein the vacuum tunnel has a first side adjacent to the first platform and a second side opposite to the first side and adjacent to the second platform, and wherein the vacuum tunnel includes a first end and a second end opposite to the first end, each end extending between the first and second sides; and a buffer stage connected to the second end for buffering the processed wafer transferred from the second platform, wherein the buffer stage includes a buffer robot disposed between a first sub-buffer stage and a second sub-buffer stage, wherein one of the at least one first platform robot is arranged to directly transfer, via a first single robot arm, the wafer between two of the first plurality of processing chambers and directly transfer, via said first single robot arm, the wafer between the first load lock and the first plurality of processing chambers, and wherein one of the at least one second platform robot is arranged to directly transfer, via a single second robot arm, the wafer between two of the second plurality of processing chambers and directly transfer, via said second single robot arm, the wafer between the second load lock and the second plurality of processing chambers.

13. The semiconductor processing station as claimed in claim 12, further comprising:

a stationary wafer stage in the vacuum tunnel; and a stationary vacuum robot disposed in the vacuum tunnel and arranged to transfer the processed wafer between the first load lock, the second load lock, the stationary wafer stage, and the first sub-buffer stage.

14. The semiconductor processing station as claimed in claim 13, wherein the stationary vacuum robot is arranged to transfer the processed wafer from the first load lock to the stationary wafer stage, to transfer the processed wafer from the stationary wafer stage to the second load lock, to transfer the processed wafer from the second load lock to the stationary wafer stage following the additional processing in the second platform, and to transfer the processed wafer from the stationary wafer stage to the first sub-buffer stage.

15. The semiconductor processing station as claimed in claim 14, further comprising:

an equipment front end module (EFEM) connected to the first end; and wherein each of the first and the second platforms includes one selected from a group consisting of a cluster platform, a linear platform and a lean platform.

16. The semiconductor processing station as claimed in claim 15, wherein the vacuum tunnel further comprises a second stationary vacuum robot arranged to transfer the wafer from a third load lock that is coupled to the EFEM to the first platform and to transfer the processed wafer from the stationary wafer stage back to the EFEM, and the vacuum tunnel having an operating pressure in a range of $10^{-4}$ to $10^{-6}$ atmosphere coupled to the buffer stage having an operating pressure in a range of $10^{-6}$ atmosphere.

17. The semiconductor processing station as claimed in claim 16, wherein the first platform, the second platform, and the vacuum tunnel comprise a first processing sub-station and wherein the semiconductor processing station further comprises a second processing sub-station coupled to the second sub-buffer stage.

18. The semiconductor processing station as claimed in claim 17, wherein the second processing sub-station comprises:

a second vacuum tunnel coupled, at a first end, to the second sub-buffer stage;

a third platform including a third plurality of processing chambers and at least one third platform robot within the third platform arranged to transfer the processed wafer between the third plurality of processing chambers; and a fourth platform including a fourth plurality of processing chambers and at least one fourth platform robot within the fourth platform arranged to transfer the processed wafer between the fourth plurality of processing chambers.

19. The semiconductor processing station as claimed in claim 13, wherein the stationary vacuum robot is arranged to transfer the processed wafer in the stationary wafer stage to the second load lock when the second load lock is available.

20. The semiconductor processing station as claimed in claim 18, further comprising:

an at least one additional vacuum robot disposed in the second vacuum tunnel; and an additional EFEM connected to the second end.

21. A semiconductor processing station, comprising:

a first platform having a first load lock, a first plurality of processing chambers, and at least one first platform robot within the first platform arranged to transfer a wafer between the first plurality of processing chambers for processing;

a second platform having a second load lock, a second plurality of processing chambers, and at least one second platform robot within the second platform arranged to transfer the processed wafer between the second plurality of processing chambers for additional processing;

a vacuum tunnel connecting the first and the second load locks, wherein the vacuum tunnel has a first side adjacent to the first platform and a second side opposite to the first side and adjacent to the second platform;

a first equipment front end module (EFEM) and a second EFEM;

a third load lock coupled between the first EFEM and a first end of the vacuum tunnel that extends between the first side and the second side; and a fourth load lock coupled between the second EFEM and an opposing second end of the vacuum tunnel that extends between the first side and the second side, wherein the vacuum tunnel comprises a first stationary vacuum robot, a second stationary vacuum robot, and a stationary wafer stage disposed between the first stationary vacuum robot and the second stationary vacuum robot, wherein one of the at least one first platform robot is arranged to directly transfer, via a first single robot arm, the wafer between two of the first plurality of processing chambers and directly transfer, via said first single robot arm, the wafer between the first load lock and the first plurality of processing chambers, and wherein one of the at least one second platform robot is arranged to directly transfer, via a second single robot arm, the wafer between two of the second plurality of processing chambers and directly transfer, via said second single robot arm, the wafer between the second load lock and the second plurality of processing chambers.

22. The semiconductor processing station as claimed in claim 21, wherein the second stationary vacuum robot is arranged to transfer the wafer from the third load lock to the first platform prior to the processing in the first platform, and wherein the first stationary vacuum robot is arranged to transfer the processed wafer from the second load lock to the fourth load lock following the additional processing in the second platform.

23. The semiconductor processing station as claimed in claim 21, wherein the first stationary vacuum robot is arranged to transfer the processed wafer from the first load lock to the stationary wafer stage, to transfer the processed wafer from the stationary wafer stage to the second load lock, and to transfer the processed wafer from the second load lock to the stationary wafer stage following the additional processing in the second platform,
  wherein the second stationary vacuum robot is arranged to transfer the wafer from the third load lock to the first platform, and
  wherein the first stationary vacuum robot is arranged to transfer the processed wafer from the second load lock to the fourth load lock.

* * * * *